(12) United States Patent
Kitsomboonloha et al.

(10) Patent No.: US 11,861,110 B1
(45) Date of Patent: Jan. 2, 2024

(54) SHIELDING FOR ELECTRONIC DEVICE DISPLAYS WITH TOUCH SENSORS

(71) Applicant: Apple Inc., Cupertino, CA (US)

(72) Inventors: Rungrot Kitsomboonloha, Los Gatos, CA (US); Donggeon Han, Santa Clara, CA (US); Jason N Gomez, Campbell, CA (US); Kyung Wook Kim, Saratoga, CA (US); Nikolaus Hammler, San Mateo, CA (US); Pei-En Chang, San Jose, CA (US); Saman Saeedi, San Diego, CA (US); Shih Chang Chang, Cupertino, CA (US); Shinya Ono, Santa Clara, CA (US); Suk Won Hong, Saratoga, CA (US); Szu-Hsien Lee, Los Gatos, CA (US); Victor H Yin, Cupertino, CA (US); Young-Jik Jo, San Jose, CA (US); Yu-Heng Cheng, Campbell, CA (US); Joyan G Sanctis, San Mateo, CA (US); Hongwoo Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/956,715

(22) Filed: Sep. 29, 2022

Related U.S. Application Data

(60) Provisional application No. 63/257,295, filed on Oct. 19, 2021.

(51) Int. Cl.
| | | |
|---|---|---|
| *G06F 3/041* | (2006.01) | |
| *G06F 3/044* | (2006.01) | |
| *H10K 59/40* | (2023.01) | |

(52) U.S. Cl.
CPC .......... *G06F 3/04182* (2019.05); *G06F 3/044* (2013.01); *H10K 59/40* (2023.02); *G06F 3/0412* (2013.01); *G06F 2203/04107* (2013.01); *G06F 2203/04112* (2013.01)

(58) Field of Classification Search
CPC .... G06F 3/04182; G06F 3/044; G06F 3/0412; G06F 2203/04107; G06F 2203/04112; H10K 59/40
See application file for complete search history.

(56) References Cited

U.S. PATENT DOCUMENTS

| | | | |
|---|---|---|---|
| 9,329,314 B2* | 5/2016 | Chen | ......................... G02B 1/16 |
| 9,864,241 B1* | 1/2018 | Pedder | ................... G06F 3/0447 |

(Continued)

*Primary Examiner* — Darlene M Ritchie
(74) *Attorney, Agent, or Firm* — Treyz Law Group, P.C.; Jason Tsai

(57) ABSTRACT

An electronic device may have a display with touch sensors. One or more shielding layers may be interposed between the display and the touch sensors. The shielding layers may include shielding structures such as a conductive mesh structure and/or a transparent conductive film. The shielding structures may be actively driven or passively biased. In the active driving scheme, one or more inverting circuits may receive a noise signal from a cathode layer in the display and/or from the shielding structures, invert the received noise signal, and drive the inverted noise signal back onto the shielding structures to prevent any noise from the display from negatively impacting the performance of the touch sensors. In the passive biasing scheme, the shielding structures may be biased to a power supply voltage.

23 Claims, 18 Drawing Sheets

(56) References Cited

U.S. PATENT DOCUMENTS

| | | | |
|---|---|---|---|
| 2011/0285661 A1* | 11/2011 | Hotelling | G06F 3/0418 |
| | | | 200/600 |
| 2016/0097882 A1* | 4/2016 | Chen | G02B 1/16 |
| | | | 359/483.01 |
| 2016/0147319 A1* | 5/2016 | Agarwal | G06F 3/044 |
| | | | 345/173 |
| 2016/0254338 A1* | 9/2016 | Lin | H01L 29/78603 |
| | | | 257/40 |
| 2017/0010740 A1 | 1/2017 | Chuang et al. | |
| 2018/0077808 A1 | 3/2018 | Seo et al. | |
| 2018/0166507 A1 | 6/2018 | Hwang et al. | |
| 2019/0098748 A1* | 3/2019 | Guo | G06F 1/1688 |
| 2020/0142532 A1 | 5/2020 | Kravets et al. | |
| 2023/0200154 A1* | 6/2023 | Bang | G06F 3/0446 |
| | | | 257/40 |

* cited by examiner

SHIELDING FOR ELECTRONIC DEVICE DISPLAYS WITH TOUCH SENSORS

This application claims the benefit of U.S. Provisional Patent Application No. 63/257,295, filed Oct. 19, 2021, which is hereby incorporated by reference herein in its entirety.

FIELD

This relates generally to electronic devices, and, more particularly, to electronic devices with displays.

BACKGROUND

Electronic devices often have displays. Touch sensors are sometimes incorporated into displays. If care is not taken, noise from a display can interfere with the touch sensor functionality.

SUMMARY

An electronic device may have a housing, display circuitry having light-emitting diode pixels formed using an anode layer and a cathode layer, touch sensor circuitry formed above and overlapping the display circuitry within the housing, and a shielding layer interposed between the display circuitry and the touch sensor circuitry. The shielding layer may include a conductive mesh structure having an array of openings aligned with respective subpixels of the display circuitry and/or a transparent conductive film. The transparent conductive film, if present, may be formed on or below the conductive mesh structure.

In some embodiments, the electronic device may include noise cancellation circuitry configured to receive a noise signal, to invert the noise signal, and to drive the inverted noise signal onto the shielding layer to prevent noise associated with the display circuitry from interfering with the touch sensor circuitry. The noise cancellation circuitry may include an inverting circuit having an input coupled to the cathode layer and/or a conductive shielding structure in the shielding layer and an output coupled to the conductive shielding structure in the shielding layer. In another embodiment, the noise cancellation circuitry may include multiple inverting circuits each having an input coupled to a conductive shielding structure in the shielding layer and an output coupled to the conductive shielding structure.

In some embodiments, the electronic device may include one or more processors configured to generate a noise canceling signal based on the display content, wherein the noise canceling signal is routed to the shielding layer to prevent noise associated with the display circuitry from interfering with the touch sensor circuitry. In other embodiments, the shielding layer can have a conductive shielding structure that is biased using a static voltage to prevent noise associated with the display circuitry from interfering with the touch sensor circuitry. The static voltage can be a ground power supply voltage, a positive power supply voltage, a reference voltage, an initialization voltage, a reset voltage, a bias voltage, or other fixed or time-varying voltage.

DETAILED DESCRIPTION

Electronic devices may be provided with displays. Displays may be used for displaying images for users. Displays may be formed from arrays of light-emitting diode pixels or other pixels. For example, a device may have an organic light-emitting diode (OLED) display. The electronic devices may have sensors such touch sensors. This provides the display with touch screen capabilities.

Figure 1:
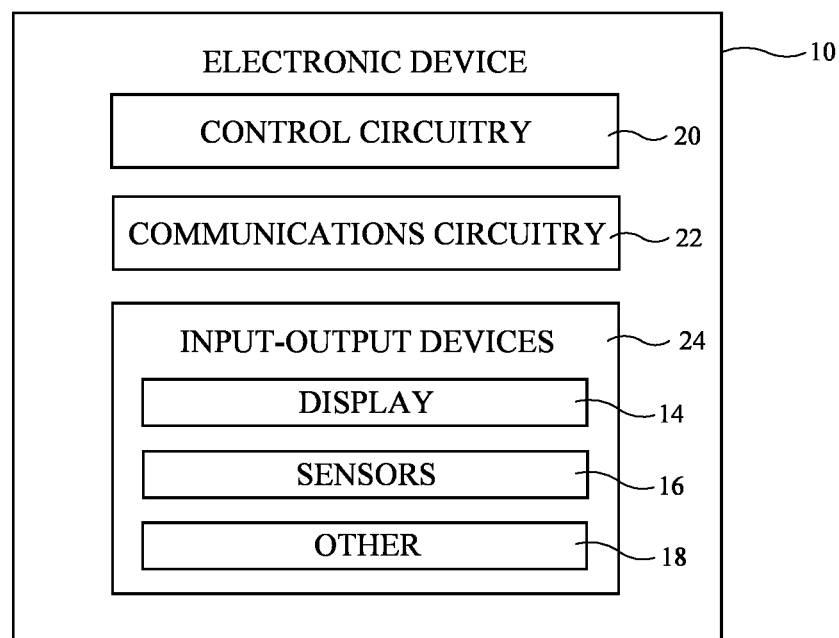
FIG. 1 is a schematic diagram of an illustrative electronic device in accordance with some embodiments.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, application processors, microcontrollers, digital signal processors, baseband processors and other wireless communications circuits, power management units, audio chips, application specific integrated circuits, etc. The processing circuitry of circuitry 20 is sometimes referred to as an application processor or a system processor. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display are sometimes described herein as an example.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. Display 14 with overlapping touch sensor circuitry that provide touch sensing functionality may sometimes be referred to as a touch screen display. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
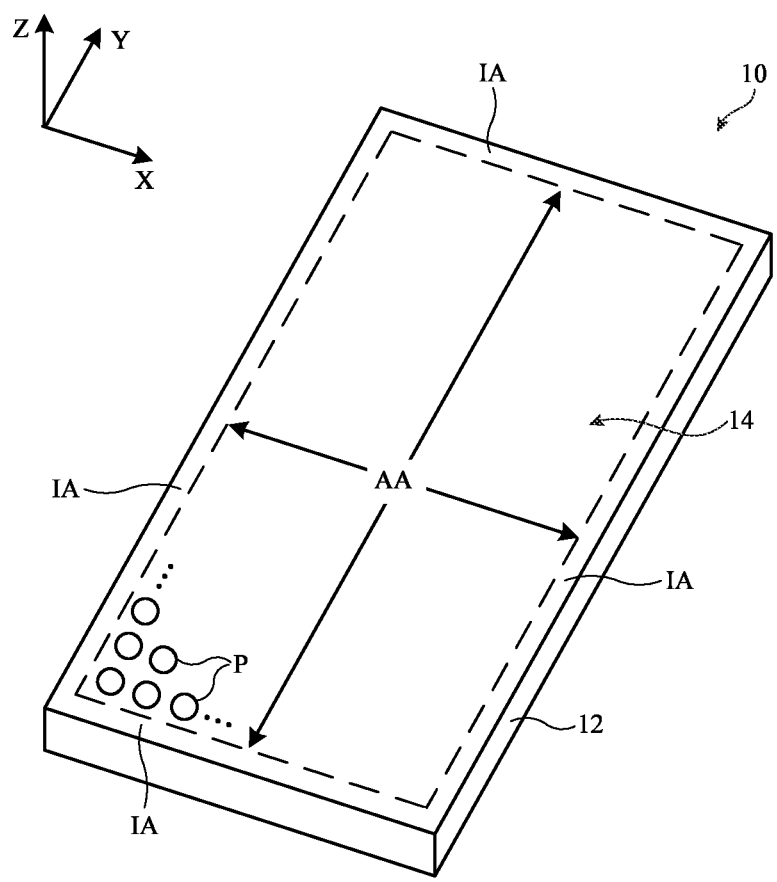
FIG. 2 is a perspective view of an illustrative electronic device in accordance with some embodiments.

FIG. 2 is a perspective view of electronic device 10 in an illustrative configuration in which device 10 is a portable electronic device such as a wristwatch, cellular telephone, or tablet computer. As shown in FIG. 2, device 10 may have a display such as display 14. Display 14 may cover some or all of the front face of device 10. Touch sensor circuitry such as two-dimensional capacitive touch sensor circuitry (as an example) may be incorporated into display 14. Display 14 may be characterized by an active area such as active area AA and an inactive border region that runs along one or more sides of active area AA (see, e.g., inactive area IA). Active area AA contains an array of pixels P that are configured to display an image for a user. Inactive area IA is free of pixels and does not display image content. If desired, there may be notch-shaped or island-shaped regions without pixels P in active area AA and these areas may contain inactive display borders (e.g., IA may extend around openings in active area AA and/or other pixel-free regions in display 14). Configurations in which inactive area IA forms a peripheral border for display 14 are sometimes described herein as an example.

Display 14 may be mounted in housing 12. Housing 12 may form front and rear housing walls, sidewall structures, and/or internal supporting structures (e.g., a frame, midplate member, etc.) for device 10. Glass structures, transparent polymer structures, and/or other transparent structures that cover display 14 and other portions of device 10 may provide structural support for device 10 and may sometimes be referred to as housing structures or display cover layer structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewalls and rear wall of device 10 may be formed from transparent structures and/or opaque structures.

Device 10 of FIG. 2 has a rectangular outline (rectangular periphery) with four corners. Device 10 may have other shapes, if desired (e.g., circular shapes, other shapes with curved and/or straight edges, etc.).

Figure 3:
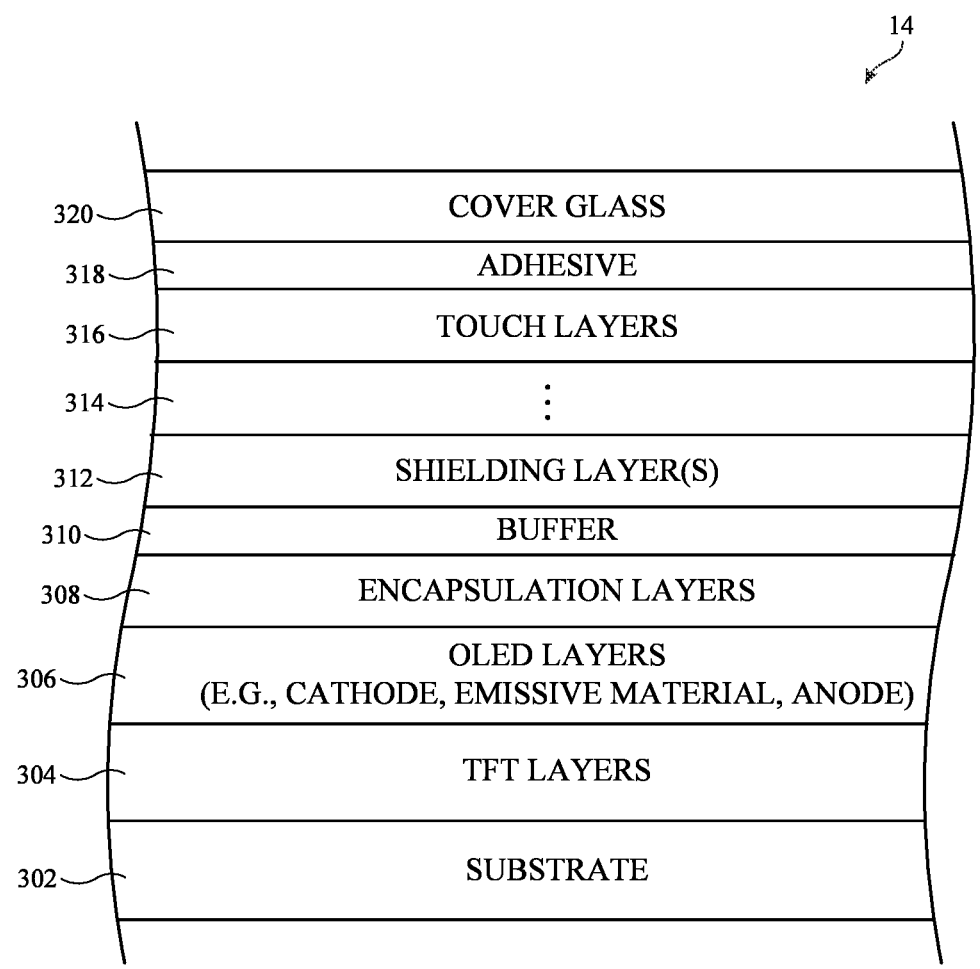
FIG. 3 is a cross-sectional side view of a touch screen display in accordance with some embodiments.

FIG. 3 is a cross-sectional side view of a touch screen display 14 (i.e., a display with overlapping touch sensor circuitry). As shown in FIG. 3, display 14 may include a substrate such as substrate 302. Substrate 302 may be formed from glass, metal, plastic, ceramic, sapphire, or other suitable substrate materials. As examples, substrate 302 may be an organic substrate formed from polyimide (PI), polyethylene terephthalate (PET), or polyethylene naphthalate (PEN). The surface of substrate 302 may optionally be covered with one or more buffer layers (e.g., inorganic buffer layers such as layers of silicon oxide, silicon nitride, etc.).

Thin-film transistor (TFT) layers 304 may be formed over substrate 302. The TFT layers 304 may include thin-film transistor circuitry such as thin-film transistors (e.g., silicon transistors, semiconducting oxide transistors, etc.), thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a cathode layer, an anode layer, and emissive material interposed between the cathode and anode layers. The cathode layer is typically formed above the anode layer. The cathode layer may be biased to a ground power supply voltage ELVSS. Ground power supply voltage ELVSS may be 0 V, −2 V, −4, −6V, less than −8 V, −10V, −12V, or any suitable ground or negative power supply voltage level. If desired, the cathode layer may be formed under the anode layer.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. This is merely illustrative. Encapsulation layers 308 may include any number of inorganic and/or organic barrier layers formed over the OLED layers 306.

One or more buffer layers such as layer 310 may be formed on encapsulation layers 308. Buffer layer 310 may be formed from silicon oxide, silicon nitride, or other suitable buffering materials.

One or more touch layers 316 that implement the touch sensor functions of touch screen display 14 may be formed over the display layers. For example, touch (sensor) layers 316 may include touch sensor circuitry such as horizontal touch sensor electrodes and vertical touch sensor electrodes collectively forming an array of capacitive touch sensor electrodes. A cover glass layer 320 may be formed over the touch sensor layers 316 using adhesive 318 (e.g., optically clear adhesive material). Cover glass 320 may serve as an outer protective layer for display 14.

In certain applications, noise from the display circuitry (e.g., the circuitry in layers 304 and 306) can leak or be inadvertently coupled to the touch sensor circuitry (e.g., the circuitry in layers 316). For example, power supply noise on the upper cathode layer can sometimes be inadvertently coupled to the touch sensor circuitry. Such display noise can potentially degrade the accuracy and performance of the touch sensor circuitry. Display noise may be particularly problematic at higher refresh rates (e.g., refresh rates of greater than 60 Hz, greater than 80 Hz, greater than 100 Hz, 120 Hz or greater, etc.).

In accordance with an embodiment, one or more shielding layers such as shielding layer(s) 312 may be interposed between the display circuitry and the touch sensor circuitry. As shown in the stackup of FIG. 3, shielding layer 312 may be formed on buffer layer 310 above the display encapsulation layers 308. Buffer layer 310 may sometimes be considered to be part of shielding layers 312. Shielding layer 312 may be implemented as a conductive mesh structure, a transparent conductive film, a conductive mesh structure overlapped by a transparent conductive film, or other suitable electrical shielding configurations. The presence of shielding layer 312 reduces the capacitive coupling between the display and touch sensor circuities and thus helps to mitigate the effect of display noise on the touch sensor structures. The shielding layer 312 can be actively driven using noise canceling signals or passively driven using a direct current (DC) power supply voltage source. Shielding layer 312 may therefore sometimes be referred to as a noise shielding layer.

If desired, one or more layers 314 may be interposed between shielding layer 312 and touch sensor layers 316. Layers 314 may include one or more polarizer films, optically clear adhesive films, and other suitable layers in a touch screen display. In general, other layers (not shown) may also be included in the stackup of FIG. 3.

Figure 4A:
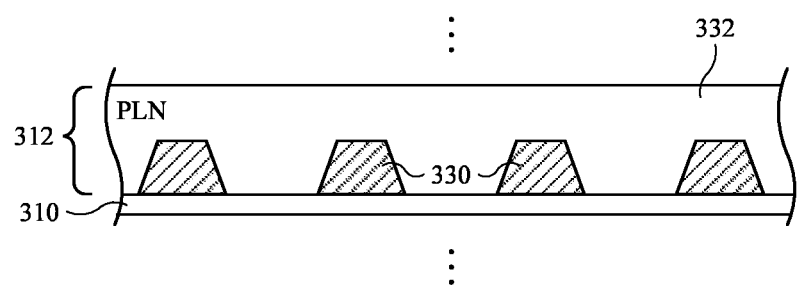
FIG. 4A is a cross-sectional side view of a shielding layer having a conductive mesh in accordance with some embodiments.

FIG. 4A illustrates one embodiment of noise shielding layer 312. As shown in FIG. 4A, noise shielding layer 312 may be formed directly on buffer layer 310. Buffer layer 310 may be formed above the display encapsulation layers (see FIG. 3). Buffer layer 310 may be a dielectric layer configured to provide improved adhesion for noise shielding layer 312. Noise shielding layer 312 may include conductive routing lines 330 collectively forming a conductive mesh structure. Conductive mesh structure 330 can be formed from metal such as molybdenum, aluminum, nickel, chromium, copper, titanium, silver, gold, ferrite, a combination of these materials, other metals, or other suitable electromagnetic shielding material. Mesh structure 330 is therefore sometimes referred to as a metal mesh structure, a metal shielding mesh structure, or a conductive mesh shielding structure. Mesh structure 330 may be formed by first depositing a layer of metal and then patterning the metal layer by selectively forming openings or slots to create the mesh configuration.

Figure 5:
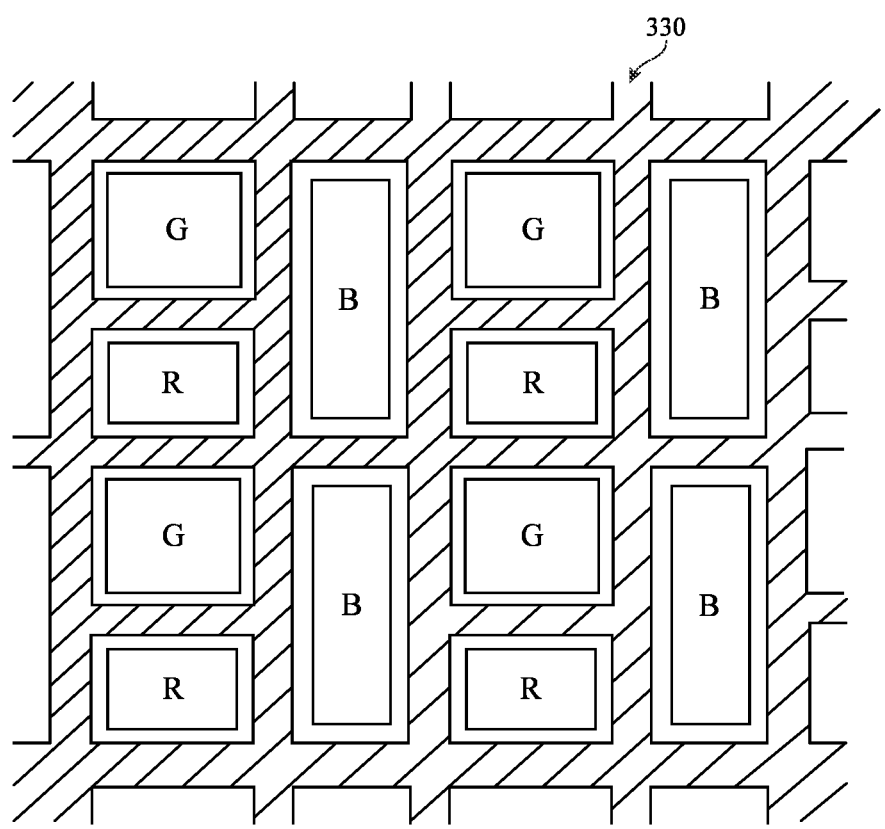
FIG. 5 is a top plan (layout) view showing a conductive (shielding) mesh having slots in which display subpixels are disposed in accordance with some embodiments.

FIG. 5 is a top plan (layout) view showing one illustrative arrangement of conductive mesh shielding structure 330. As shown in FIG. 5, conductive mesh shielding structure 330 may be configured as a conductive grid having openings (windows or slots) aligned with respective display subpixels. For example, mesh shielding structure 330 may include a first set of openings in the grid overlapping with the green (G) display subpixels, a second set of openings in the grid overlapping with the red (R) display subpixels, and a third set of openings in the grid overlapping with the blue (B) display subpixels. A uniform mesh or grid-like structure configured in this way helps maximize noise shielding capabilities while minimizing electrical loading and potential optical degradation due to the shielding layer 312.

In the example of FIG. 5, the openings associated with the blue subpixels may be larger than the openings associated with the green subpixels, which are larger than the opening associated with the red subpixels. This is merely illustrative. As another example, the openings associated with the different color subpixels may be the same size. As another example, the openings associated with the green subpixels may be larger than the openings associated with the blue subpixels, which are larger than the opening associated with the red subpixels. As another example, the openings associated with the red subpixels may be larger than the openings associated with the blue subpixels, which are larger than the opening associated with the green subpixels. As another example, the openings associated with the blue subpixels may be larger than the openings associated with the red subpixels, which are larger than the opening associated with the green subpixels. As another example, the openings associated with the green subpixels may be larger than the openings associated with the red subpixels, which are larger than the opening associated with the blue subpixels. As another example, the openings associated with the red subpixels may be larger than the openings associated with the green subpixels, which are larger than the opening associated with the blue subpixels.

Referring back to FIG. 4A, a planarization layer such as PLN layer 332 may be formed over metal shielding mesh 330. Planarization layer 332 may be formed from organic dielectric materials such as polymer. Planarization layer 332 may be configured to protect the metal shielding mesh 330 from corrosion. If desired, one or more additional buffer layers may be formed between mesh 330 and planarization layer 332 to promote improved adhesion and/or to provide improved protection from external elements or contaminants.

Figure 4B:
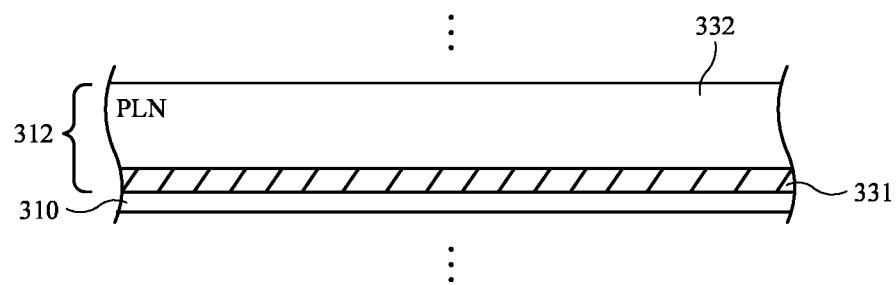
FIG. 4B is a cross-sectional side view of a shielding layer having a transparent conductive film in accordance with some embodiments.

The embodiment of FIG. 4A in which shielding layer 312 includes metal mesh structure 330 is merely illustrative. FIG. 4B shows another embodiment in which shielding layer 312 includes a transparent conductive film such as transparent conductive film 331 without any mesh structure. As shown in FIG. 4B, transparent conductive film 331 may be formed directly on buffer layer 310. Buffer layer 310 may be formed above the display encapsulation layers (see FIG. 3). Buffer layer 310 may be a dielectric layer configured to provide improved adhesion for transparent conductive film 331. Transparent conductive film 331 can be formed from indium tin oxide (ITO), indium zinc oxide (IZO), zinc tin oxide (ZTO), fluorine tin oxide (FTO), aluminum zinc oxide (AZO), a combination of these materials, multiple layers of one or more of these materials, and/or other transparent conducting film material. Transparent conductive film 331 may be formed by depositing a thin layer of transparent conductive material on buffer layer 310. Transparent conductive film 331 can be configured to help maximize noise shielding capabilities and optical transmittance through shielding layer 312. Film 331 can therefore sometimes be referred to as a transparent shielding layer.

A planarization layer such as PLN layer 332 may be formed over transparent conductive film 331. Planarization layer 332 may be formed from organic dielectric materials such as polymer. Planarization layer 332 may be configured to protect the transparent conductive (shielding) layer 331 from corrosion. If desired, one or more additional buffer layers may be formed between transparent conductive layer 331 and planarization layer 332 to promote improved adhesion and/or to provide improved protection from external elements or contaminants.

Figure 4C:
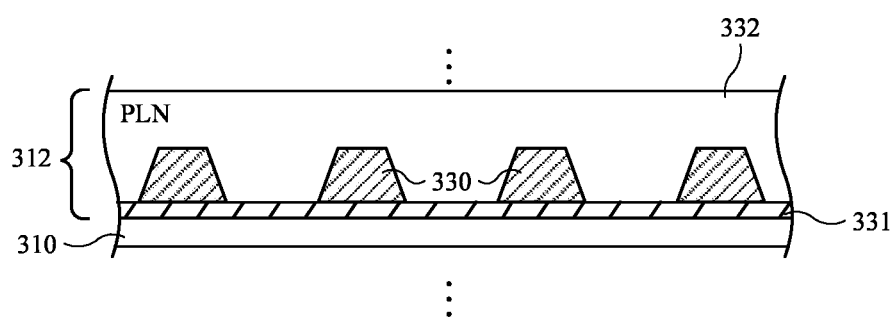
FIG. 4C is a cross-sectional side view of a shielding layer having a transparent conductive film formed below a conductive mesh in accordance with some embodiments.

The example of FIG. 4A in which shielding layer 312 includes metal mesh shielding structure 330 and the example of FIG. 4B in which shielding layer 312 includes transparent conductive film 331 are merely illustrative. FIG. 4C shows another embodiment in which shielding layers 312 include both metal mesh shielding structure 330 and transparent conductive film 331. As shown in FIG. 4C, transparent conductive film 331 may be deposited directly on buffer layer 310. Metal mesh shielding structure 330 may then be deposited and patterned over transparent conductive film 331. Planarization layer 332 may then be formed over metal mesh shielding structure 330. If desired, one or more additional buffer layers may be formed between metal mesh shielding structure 330 and planarization layer 332.

Figure 4D:
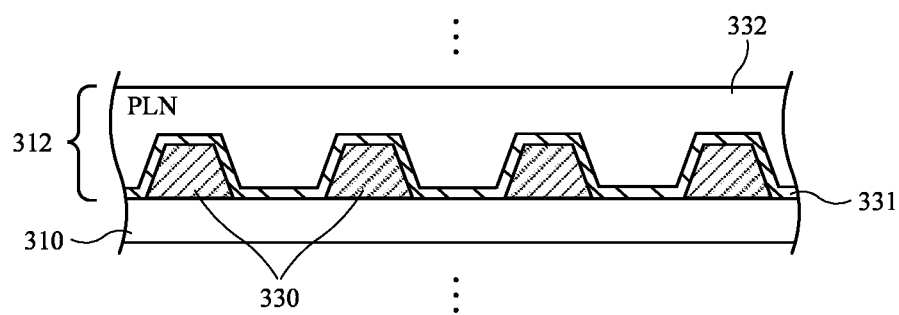
FIG. 4D is a cross-sectional side view of a shielding layer having a transparent conductive film formed over a conductive (shielding) mesh in accordance with some embodiments.

The example of FIG. 4C in which shielding layer 312 includes transparent conductive film 331 formed under metal mesh shielding structure 330 is merely illustrative. FIG. 4D shows another embodiment in which transparent conductive film 331 is formed over metal mesh shielding structure 330. As shown in FIG. 4D, metal mesh shielding structure 330 may be deposited and patterned directly on buffer layer 310. Transparent conductive film 331 may then be deposited over metal mesh shielding structure 330. Planarization layer 332 may then be formed over transparent conductive film 331. If desired, one or more additional buffer layers may be formed between transparent conductive layer 331 and planarization layer 332.

Figure 6:
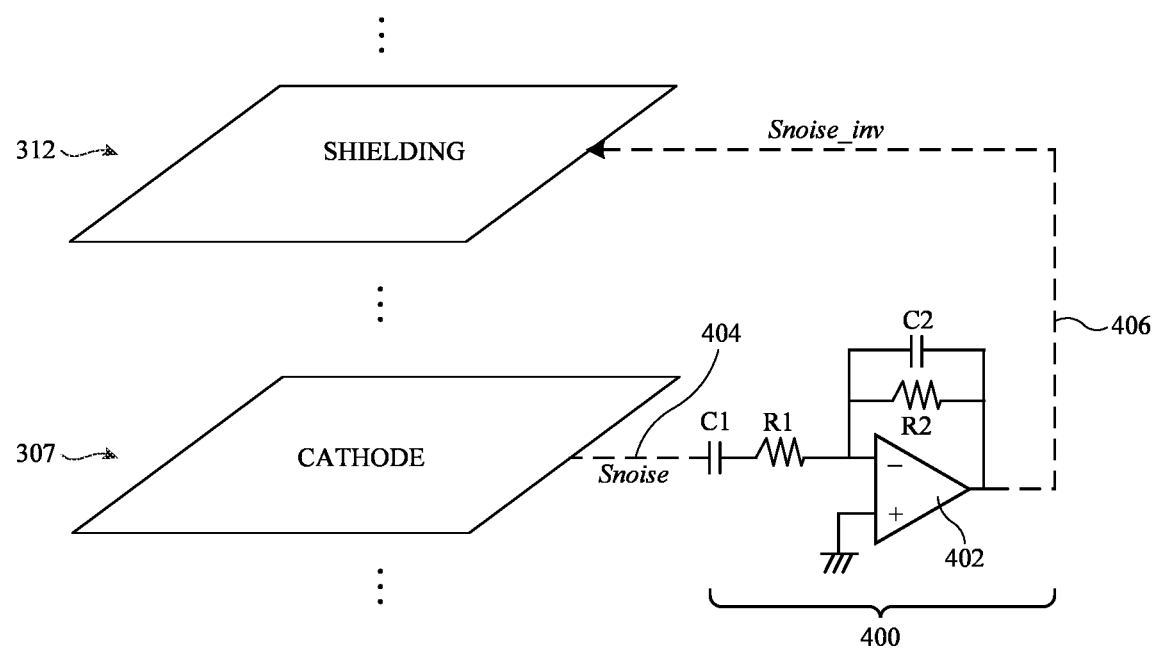
FIG. 6 is an exploded view showing how noise from the display cathode layer can be inverted and provided to a shielding layer to achieve display noise cancellation in accordance with some embodiments.

Shielding layer(s) 312 can be actively driven or passively biased. FIG. 6 is an exploded view showing how shielding layer 312 can be actively driven based on signals from the display cathode layer 307 in accordance with some embodiments. As shown in FIG. 6, a display cathode layer such as cathode layer 307 (see, e.g., OLED layers 306 in FIG. 3 having a cathode layer) may be coupled to an input of an inverting circuit 400 via input path 404. Inverting circuit 400 may be formed on a printed circuit separate from the display substrate 302 of FIG. 3. Inverting circuit 400 may have an output that is coupled to shielding layer 312 via output path 406. Inverting circuit 400 may include an operational amplifier 402 having a first (positive) input coupled to ground, a second (negative) input, and an output coupled to output path 406. Inverting circuit 400 may include a first capacitor C1 and a first resistor R1 coupled in series between input path 404 and the negative input of operational amplifier 402. Inverting circuit 400 may further include a second capacitor and a second resistor T2 coupled in parallel between the output and the negative input of operational amplifier 402. The particular implementation of inverting circuit 400 as shown in FIG. 6 is merely illustrative. If desired, other types of signal inverting circuit can be used.

Shielding layer 312 may be of the type described in connection with FIGS. 4A-4D (as examples). Arranged in this way, inverting circuit 400 may be configured to receive a display noise signal Snoise from cathode layer 307, to invert the display noise signal to generate a corresponding inverted display noise signal Snoise_inv, and to actively drive shielding layer 312 using the inverted display noise signal Snoise_inv. Noise signal Snoise may represent a cathode noise, a display power supply noise, or other noise associated with the TFT/OLED layers. By actively feeding the inverted display noise to shielding layer 312, any noise leaking from the cathode layer 307 to the touch layers can be effectively cancelled out or reduced. Inverting circuit 400 coupled and operated in this way is therefore sometimes referred to as noise compensation circuitry or noise cancellation circuitry 400.

Figure 7:
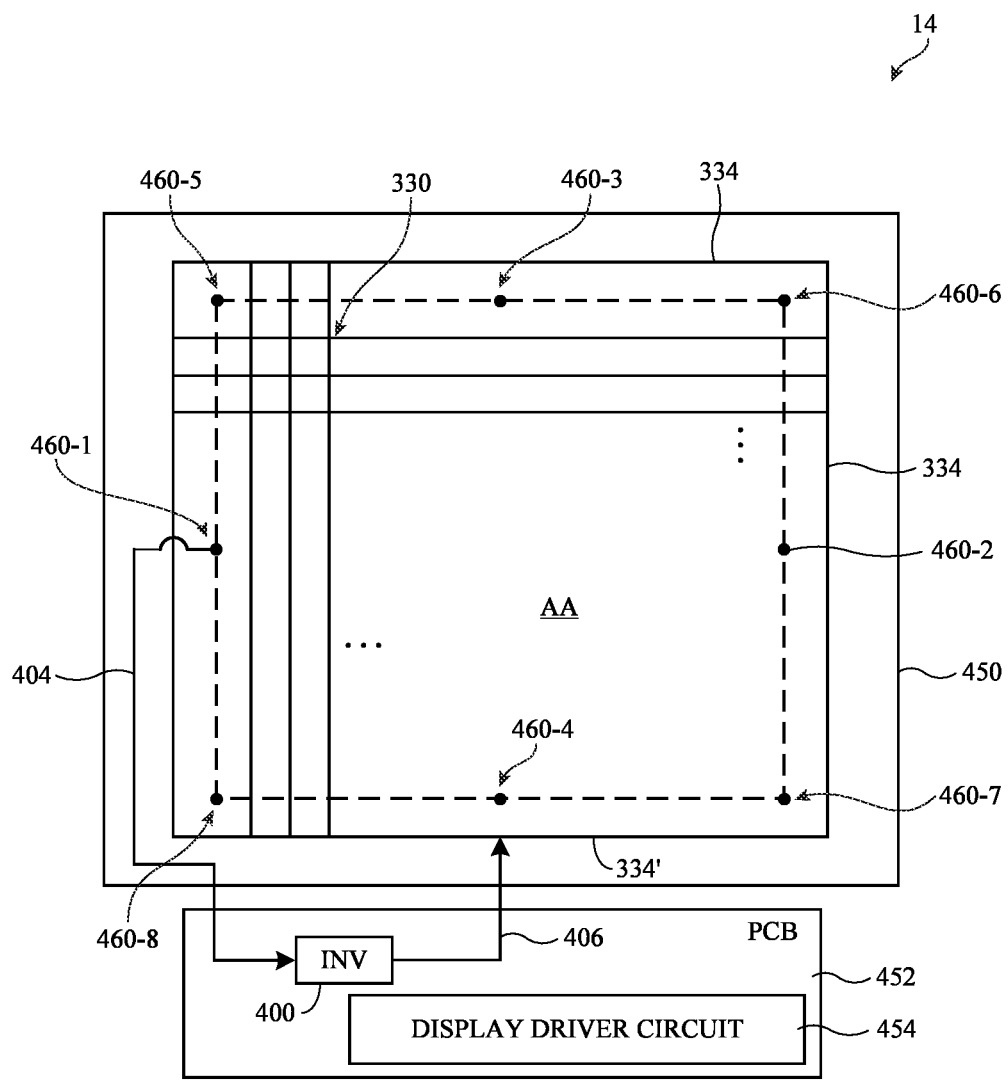
FIG. 7 is a top plan view of a display having illustrative noise cancellation circuitry with an input coupled to a center of a left edge of the cathode layer and an output coupled to a bottom edge of the shielding mesh in accordance with some embodiments.

FIG. 7 is a top plan (layout) view of display 14 showing how noise cancellation circuitry 400 can be coupled to the display and shielding layers in accordance with some embodiments. As shown in FIG. 7, the display and shielding layers may be formed on a substrate 450. Substrate 450 may be formed from glass, plastic, polymer, ceramic, sapphire, metal, or other suitable substrate materials. Substrate 450 is shown to have a rectangular peripheral outline. This is illustrative. Substrate 450 can have straight edges and curved corners. Display pixels (e.g., organic light-emitting diode pixels) may be formed in an active area AA delineated by the dotted outline. Conductive shielding mesh structure 330 may overlap the active area AA (e.g., mesh 330 may have an array of grid openings aligned with display subpixels in the active area) and may have a conductive border 334 that completely surrounds active area AA.

When viewed from the perspective of FIG. 7, display substrate 450 of the display panel can be said to have a left peripheral edge, a right peripheral edge, a top peripheral edge joining the top portions of the left and right outer edges, and a bottom peripheral edge joining the bottom portions of the left and right outer edges. Conductive border 334 may be formed along the left, top, right, and bottom peripheral edges of display substrate 450.

The display circuitry formed on substrate 450 may be controlled using components such as a display driver integrated circuit 454 (sometimes referred to as a timing controller integrated circuit) that is formed on a separate printed circuit board 452. Printed circuit board 452 may be a flexible printed circuit cable that joins the display circuitry to control circuitry 20 (see FIG. 1). Display driver integrated circuit 454 may communicate directly with control circuitry 20 to send control and data signals to column driver circuitry and gate driver circuitry on the display panel. In other words, control circuitry 20 controls display 14 through display driver integrated circuit 454 (i.e., control circuitry 20 is coupled to display 14 via timing controller 454).

Noise cancelling circuitry 400 can be formed on printed circuit 452. Noise cancelling circuitry 400 (e.g., operational amplifier 402 and associated components C1, C2, R1, and R2 as shown in FIG. 6) may be formed as discrete components surface mounted on printed circuit 452, may be formed as part of display driver integrated circuit 454, or may be formed as part of a separate integrated circuit chip mounted on printed circuit 452. In the example of FIG. 7, the input of circuitry 400 may be coupled to the center point 460-1 of the left edge of the cathode layer (i.e., along the left peripheral edge of the display panel) via input path 404, whereas the output of circuitry 400 may be coupled to one or more locations along bottom edge 334' of the conductive border 334 (i.e., along the bottom peripheral edge of the display panel) via output driving path 406.

The example of FIG. 7 in which the input of noise cancellation circuitry 400 is coupled to the center point 460-1 along the left edge of the cathode layer is merely illustrative. As another example, the input of circuitry 400 may be coupled to a center point (see location 460-2) along the right edge of the cathode layer. As another example, the input of circuitry 400 may be coupled to a center point (see location 460-3) along the top edge of the cathode layer. As another example, the input of circuitry 400 may be coupled to a center point (see location 460-4) along the bottom edge of the cathode layer. As another example, the input of circuitry 400 may be coupled to a top left corner (see location 460-5) of the cathode layer. As another example, the input of circuitry 400 may be coupled to a top right corner (see location 460-6) of the cathode layer. As another example, the input of circuitry 400 may be coupled to a bottom right corner (see location 460-7) of the cathode layer. As yet another example, the input of circuitry 400 may be coupled to a bottom left corner (see location 460-8) of the cathode layer.

Figure 8:
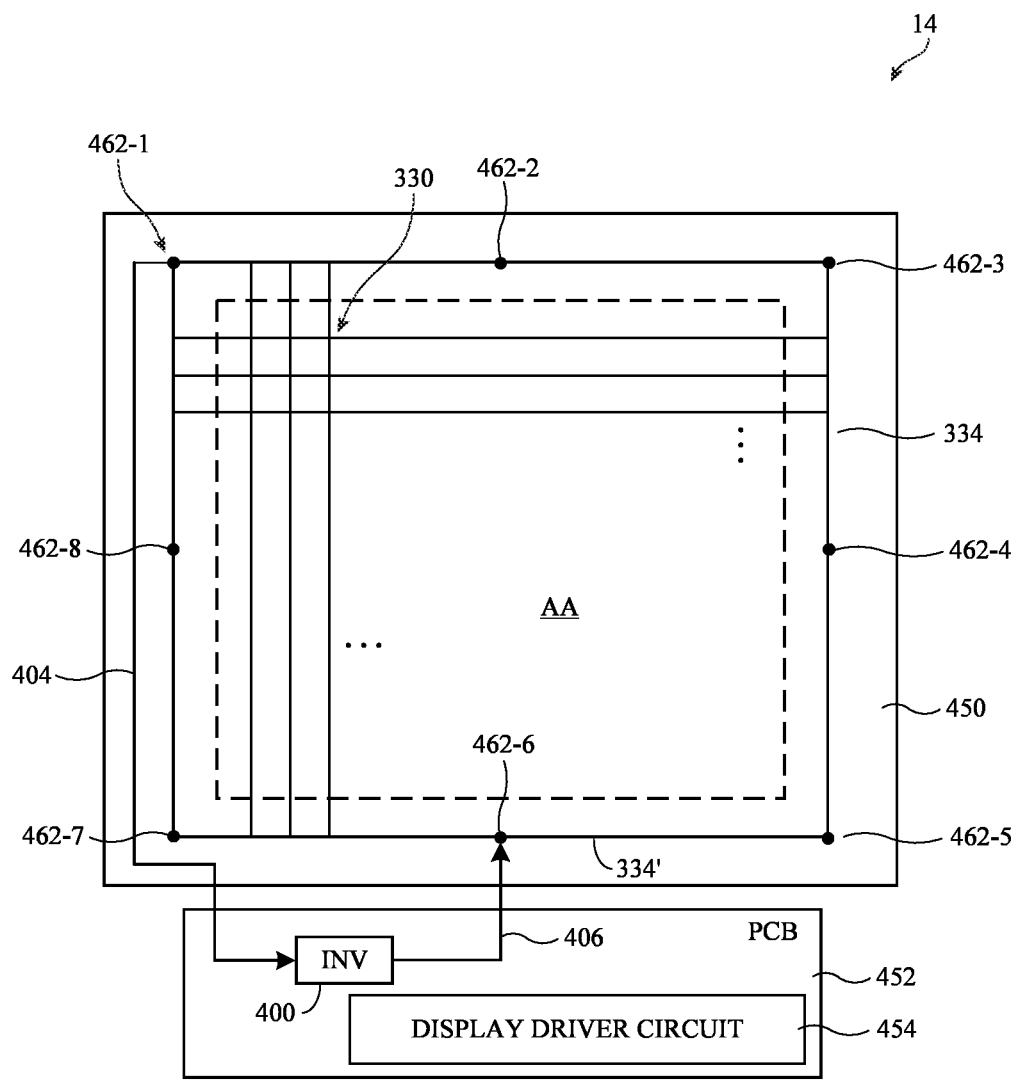
FIG. 8 is a top plan view of a display having illustrative noise cancellation circuitry with an input coupled to a top left corner of the shielding mesh and an output coupled to a bottom edge of the shielding mesh in accordance with some embodiments.

The embodiment of FIGS. 6 and 7 in which the input of the noise cancelling circuitry 400 is coupled to one of the display layers (e.g., the cathode layer) is merely illustrative. FIG. 8 shows another embodiment where the input of noise cancellation circuitry 400 is coupled to the shielding layer. As shown in FIG. 8, the display and shielding layers may be formed on substrate 450. Display pixels may be formed in an active area AA delineated by the dotted region. Conductive shielding mesh structure 330 may overlap the active area AA (e.g., mesh 330 may have an array of grid openings aligned with display subpixels in the active area) and may have a conductive border 334 that completely surrounds active area AA.

When viewed from the perspective of FIG. 8, display substrate 450 of the display panel can be said to have a left peripheral edge, a right peripheral edge, a top peripheral edge joining the top portions of the left and right outer edges, and a bottom peripheral edge joining the bottom portions of the left and right outer edges. Conductive border 334 may be formed along the left, top, right, and bottom peripheral edges of display substrate 450. Display driver integrated circuit 454 (sometimes referred to as a timing controller) may be formed on printed circuit 452 adjoining the bottom peripheral edge of the display panel.

Noise cancelling circuitry 400 (e.g., noise cancellation circuitry of the type shown in FIG. 6) can be formed on printed circuit 452. Noise cancelling circuitry 400 may be formed as discrete components surface mounted on printed circuit 452, may be formed as part of display driver integrated circuit 454, or may be formed as part of a separate integrated circuit chip mounted on printed circuit 452. In the example of FIG. 8, the input of circuitry 400 may be coupled to the top left corner (see location 462-1) of the conductive border 334 via input path 404, whereas the output of circuitry 400 may be coupled to one or more locations along bottom edge 334' of the conductive border 334 (i.e., along the bottom peripheral edge of the display panel) via output driving path 406. Connected in this way, any potential noise coupled onto shielding mesh structure 330 can be canceled or compensated by the inverted noise signal that is driven back onto shielding mesh structure 330.

The example of FIG. 8 in which the input of noise cancelling circuitry 400 is coupled to the top left corner 462-1 of the shielding structure is merely illustrative. As another example, the input of circuitry 400 may be coupled to a center point (see location 462-2) along the top edge of conductive border 334 in the shielding structure. As another example, the input of circuitry 400 may be coupled to a top right corner (see location 460-3) of conductive border 334 in the shielding structure. As another example, the input of circuitry 400 may be coupled to a center point (see location 462-4) along the right edge of conductive border 334 in the shielding structure. As another example, the input of circuitry 400 may be coupled to a bottom right corner (see location 462-5) of conductive border 334 in the shielding structure. As another example, the input of circuitry 400 may be coupled to a center point (see location 462-6) along one or more locations along bottom edge 334' of the shielding structure. As another example, the input of circuitry 400 may be coupled to a bottom left corner (see location 462-7) of conductive border 334 in the shielding structure. As yet another example, the input of circuitry 400 may be coupled to a center point (see location 462-8) along the left edge of conductive border 334 in the shielding structure.

The top plan view of FIG. 8 may represent shielding layer 312 of the type shown in FIG. 4A that includes conductive shielding mesh structure 330. If desired, FIG. 8 may also represent shielding layer 312 of the type shown in FIG. 4C where transparent conductive film 331 is formed below the mesh shielding structure 330 or shielding layer 312 of the type shown in FIG. 4D where transparent conductive film 331 is formed above the mesh shielding structure 330. Transparent conductive film 331 is not explicitly labeled in FIG. 8 to avoid obscuring the present embodiments.

Figure 9:
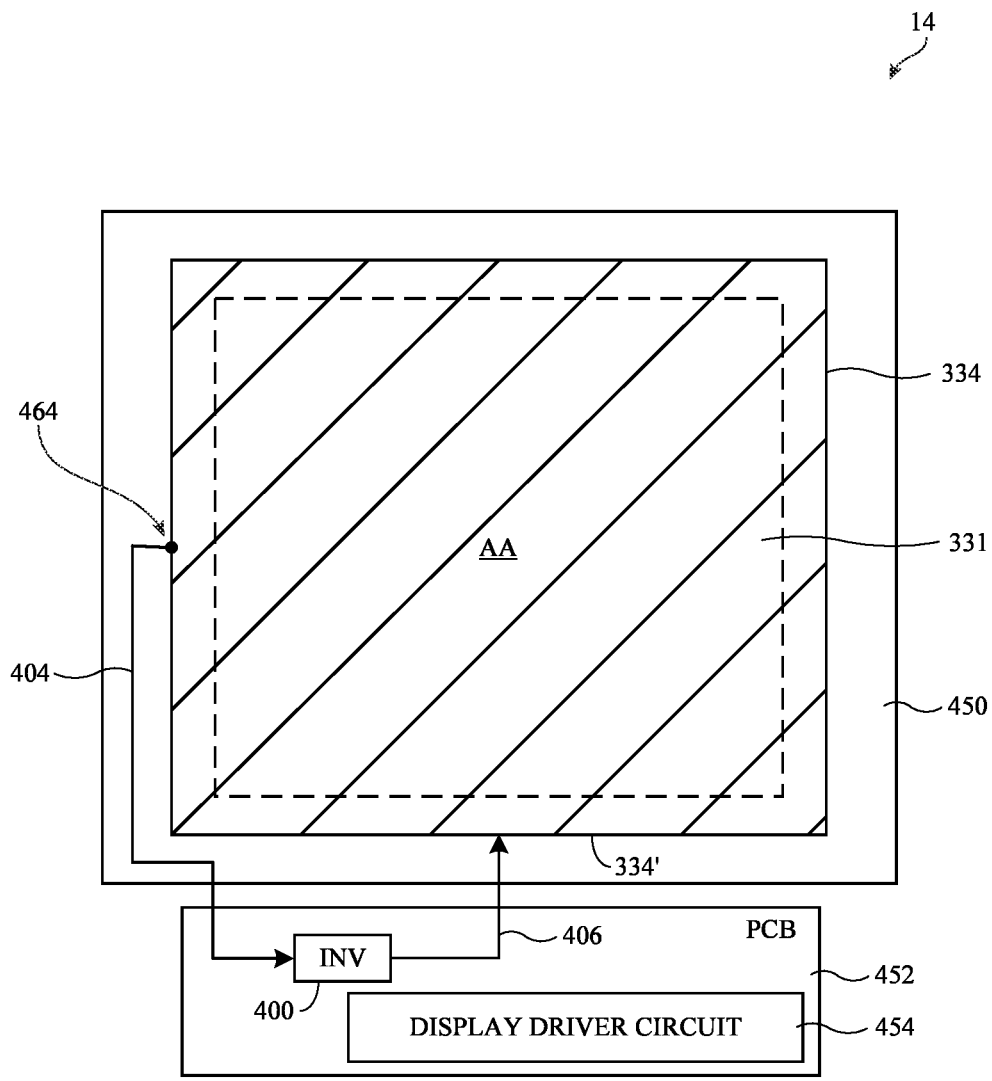
FIG. 9 is a top plan view of a display having illustrative noise cancellation circuitry with an input coupled to a center of a left edge of a conductive border in the shielding layer and an output coupled to a bottom edge of the conductive border in accordance with some embodiments.

The example of FIG. 8 in which the shielding layer includes mesh structure 330 is merely illustrative. FIG. 9 shows another embodiment in which the shielding layer includes transparent conductive film 331 but without any mesh structure (see, e.g., shielding layer 312 of the type shown in FIG. 4B). As shown in FIG. 9, the display and shielding layers may be formed on substrate 450. Display pixels may be formed in an active area AA delineated by the dotted area. Transparent conductive film 331 may cover and overlap the active area AA and may be electrically coupled to a conductive border 334 that completely surrounds active area AA.

When viewed from the perspective of FIG. 9, display substrate 450 of the display panel can be said to have a left peripheral edge, a right peripheral edge, a top peripheral edge joining the top portions of the left and right outer edges, and a bottom peripheral edge joining the bottom portions of the left and right outer edges. Conductive border 334 may be formed along the left, top, right, and bottom peripheral edges of display substrate 450. Display driver integrated circuit 454 (sometimes referred to as a timing controller) may be formed on printed circuit 452 disposed along the bottom peripheral edge of the display panel.

Noise cancelling circuitry 400 (e.g., noise cancellation circuitry of the type shown in FIG. 6) can be formed on printed circuit 452. The noise cancelling circuitry may be formed as discrete components surface mounted on printed circuit 452, may be formed as part of display driver integrated circuit 454, or may be formed as part of a separate integrated circuit chip mounted on printed circuit 452. In the example of FIG. 9, the input of circuitry 400 may be coupled to a center point (see location 464) along the left edge of conductive border 334 (i.e., along the left peripheral edge of the display panel) via input path 404, whereas the output of circuitry 400 may be coupled to one or more locations along bottom edge 334' of the conductive border 334 (i.e., along the bottom peripheral edge of the display panel) via output driving path 406. Connected in this way, any potential noise coupled onto shielding mesh structure 330 can be canceled or compensated by the inverted noise signal that is driven back onto transparent conductive film 331.

The example of FIG. 9 in which the input of circuitry 400 is coupled to the center point 464 along the left edge of conductive border 334 in the shielding layer is merely illustrative. If desired, the input of circuitry 400 may alternatively be coupled to the top left corner of border 334 in the shielding layer, to a center point along the top edge of border 334 in the shielding layer, to a top right corner of border 334 in the shielding layer, to a center point along a right edge of border 334 in the shielding layer, to a bottom right corner of border 334 in the shielding layer, to a center point along bottom edge 334' in the shielding layer, or to a bottom left corner of border 334 in the shielding layer (see, e.g., alternate tapping point locations as shown in the example of FIG. 8).

Figure 10:
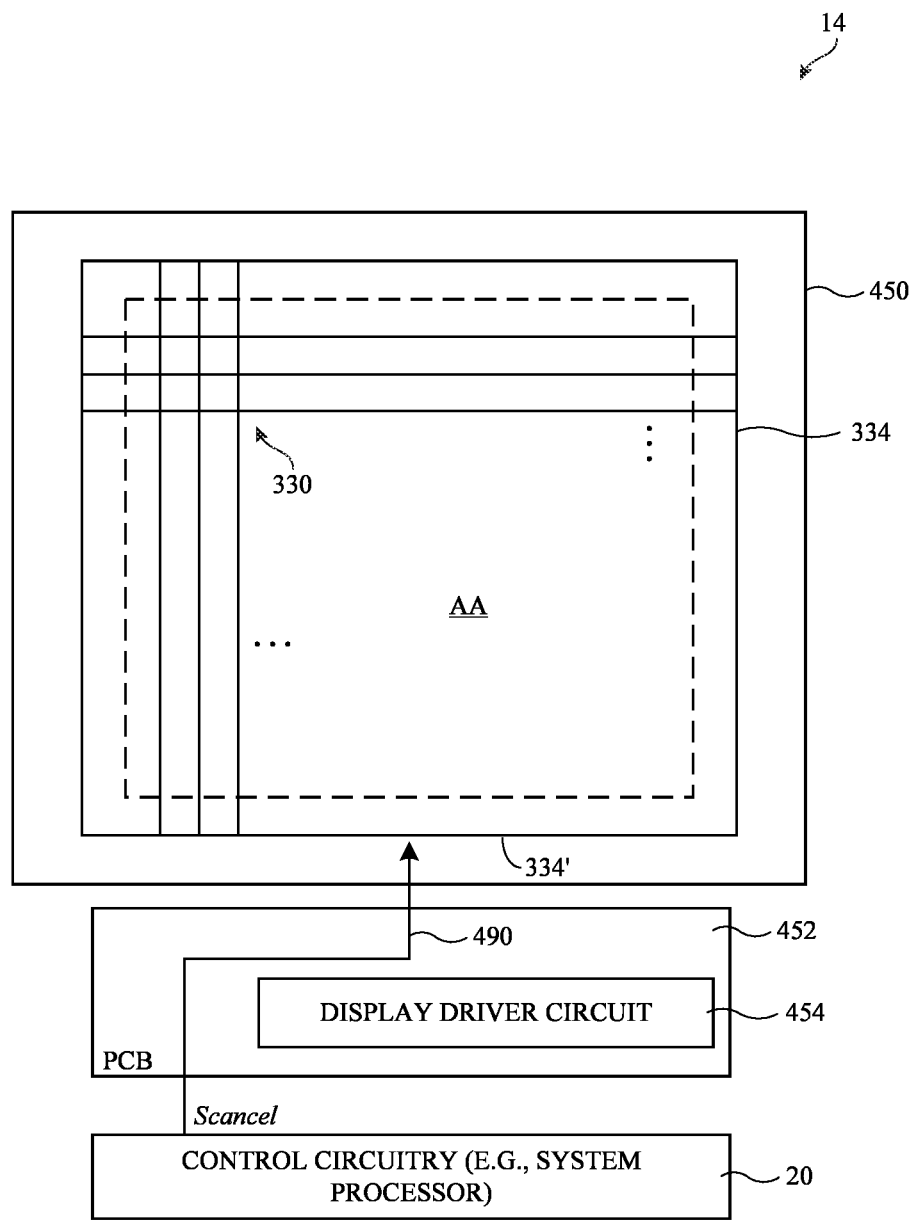
FIG. 10 is a top plan view of a display having a system processor configured to generate a noise cancellation signal that is fed to a bottom edge of the shielding mesh in accordance with some embodiments.

The examples of FIGS. 6-9 in which the shielding layer receives an inverted signal from an analog circuit such as circuitry 400 of the type shown in FIG. 6 is merely illustrative. FIG. 10 shows another embodiment in which the shielding layer receives a noise cancellation signal generated by control circuitry 20. As shown in FIG. 10, one or more processors within control circuitry 20 (e.g., a system processor or an application processor) may generate noise cancellation signal Scancel using digital signal processing that is optionally dependent on the display content. For example, a given display content may result in a given display noise characteristic, so the system processor may be configured to generate noise compensation signal Scancel that can effectively cancel out or mitigate the given display noise characteristic produced by the given display content. The system processor may be mounted on a printed circuit board separate from printed circuit 452 (e.g., the system processor is sometimes mounted on a main logic board separate from flex circuit 452). Signal Scancel may be routed to one or more locations along bottom edge 334' of the shielding structure via output path 490 (as an example).

Figure 11:
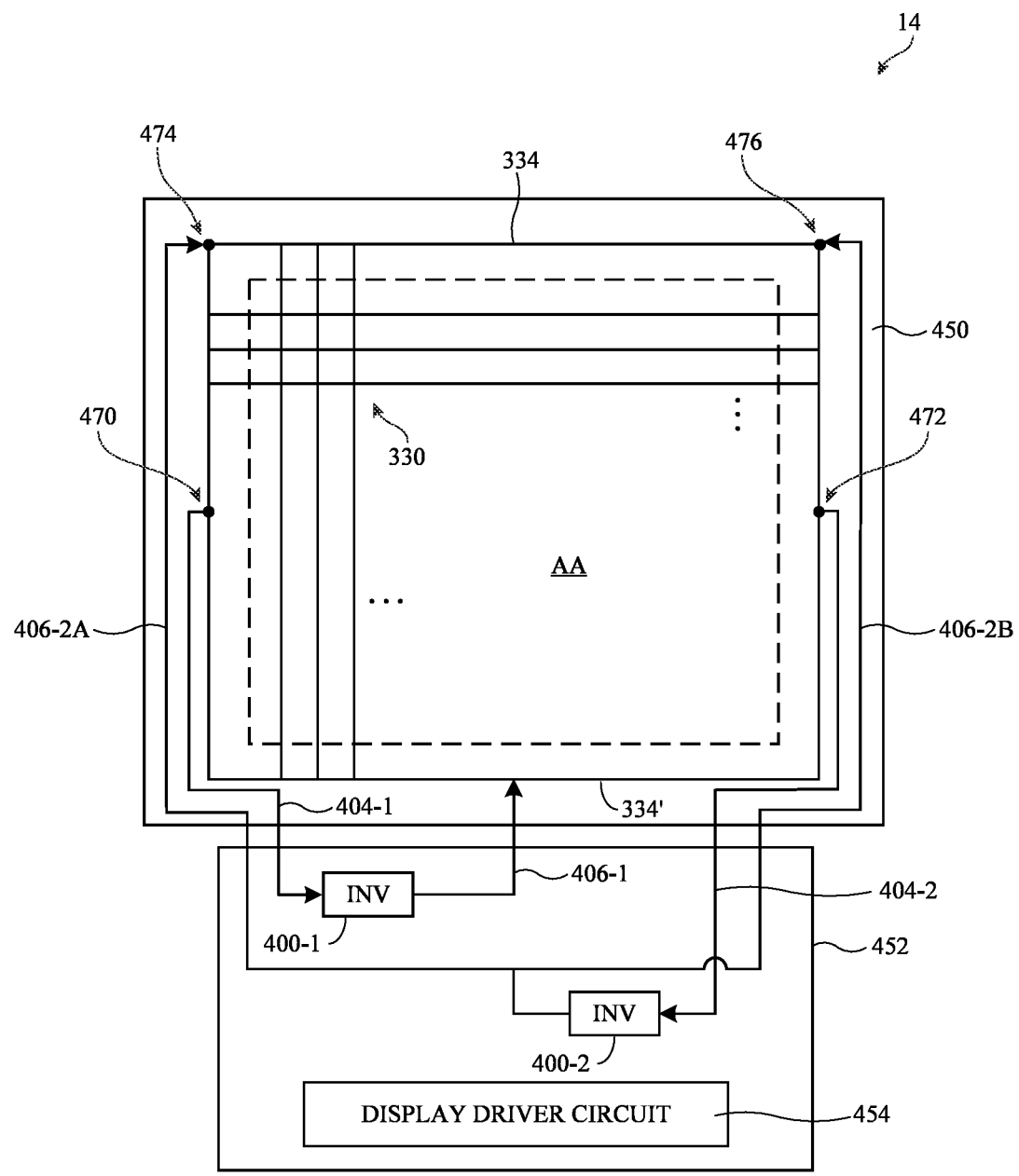
FIG. 11 is a top plan view of a display having illustrative noise cancellation circuitry with inputs coupled to centers of opposing edges of the shielding mesh and outputs coupled to different corners of the shielding mesh in accordance with some embodiments.

The examples of FIG. 6-9 in which the noise cancellation circuitry includes only one inverting circuit is merely illustrative. FIG. 11 shows another embodiment in which the noise cancelling circuitry includes multiple inverting circuits for injecting inverted display noise signals onto different edges of the shielding structure. As shown in FIG. 11, the display and shielding layers may be formed on substrate 450. Display pixels may be formed in an active area AA delineated by the dotted region. Conductive shielding mesh structure 330 may overlap the active area AA (e.g., mesh 330 may have an array of grid openings aligned with display subpixels in the active area) and may have a conductive border 334 that completely surrounds active area AA.

When viewed from the perspective of FIG. 11, display substrate 450 of the display panel can be said to have a left peripheral edge, a right peripheral edge, a top peripheral edge joining the top portions of the left and right outer edges, and a bottom peripheral edge joining the bottom portions of the left and right outer edges. Conductive border 334 may be formed along the left, top, right, and bottom peripheral edges of display substrate 450. Display driver integrated circuit 454 (sometimes referred to as a timing controller) may be formed on printed circuit 452 disposed along the bottom peripheral edge of the display panel.

In the example of FIG. 11, the noise cancelling circuitry may include a first inverting circuit 400-1 and a second inverting circuit 400-2. Inverting circuits 400-1 and 400-2 may each be implemented using an inverting circuit configuration of the type shown in FIG. 6 or other types of signal inverting circuit. The noise cancelling circuitry can be formed on printed circuit 452 as discrete components surface mounted on printed circuit 452, as part of display driver integrated circuit 454, or as part of a separate integrated circuit chip mounted on printed circuit 452. First inverting circuit 400-1 may have an input coupled to a center point (see location 470) along a left edge of conductive border 334 via input path 404-1 and may have an output coupled to a center point along bottom edge 334' of the shielding structure. Second inverting circuit 400-2 may have an input coupled to a center point (see location 472) along a right edge of conductive border 334 via input path 404-2 and may have an output that is coupled to a top left corner (see location 474) of the shielding structure via first output path 406-2a and that is coupled to a top right corner (see location 476) of the shielding structure via second output path 406-2b. Using a double-ended or head-to-head driving scheme in this way can help reduce signal settling time and further enhance noise cancellation capabilities.

The example of FIG. 11 in which the inputs of inverting circuits 400-1 and 400-2 are coupled to the center points of left and right edges of the shielding structure is merely illustrative. If desired, the inputs of inverting circuits 400-1 and 400-2 can be coupled to any other location(s) along conductive border 334. Similarly, the outputs of inverting circuits 400-1 and 400-2 can be coupled to any other location(s) along conductive border 334.

The top plan view of FIG. 11 may represent shielding layer 312 of the type shown in FIG. 4A that includes conductive shielding mesh structure 330. If desired, FIG. 11 may also represent shielding layer 312 of the type shown in FIG. 4C where transparent conductive film 331 is formed below the mesh shielding structure 330 or shielding layer 312 of the type shown in FIG. 4D where transparent conductive film 331 is formed above the mesh shielding structure 330. Transparent conductive film 331 is not explicitly labeled in FIG. 11 to avoid obscuring the present embodiments.

Figure 12:
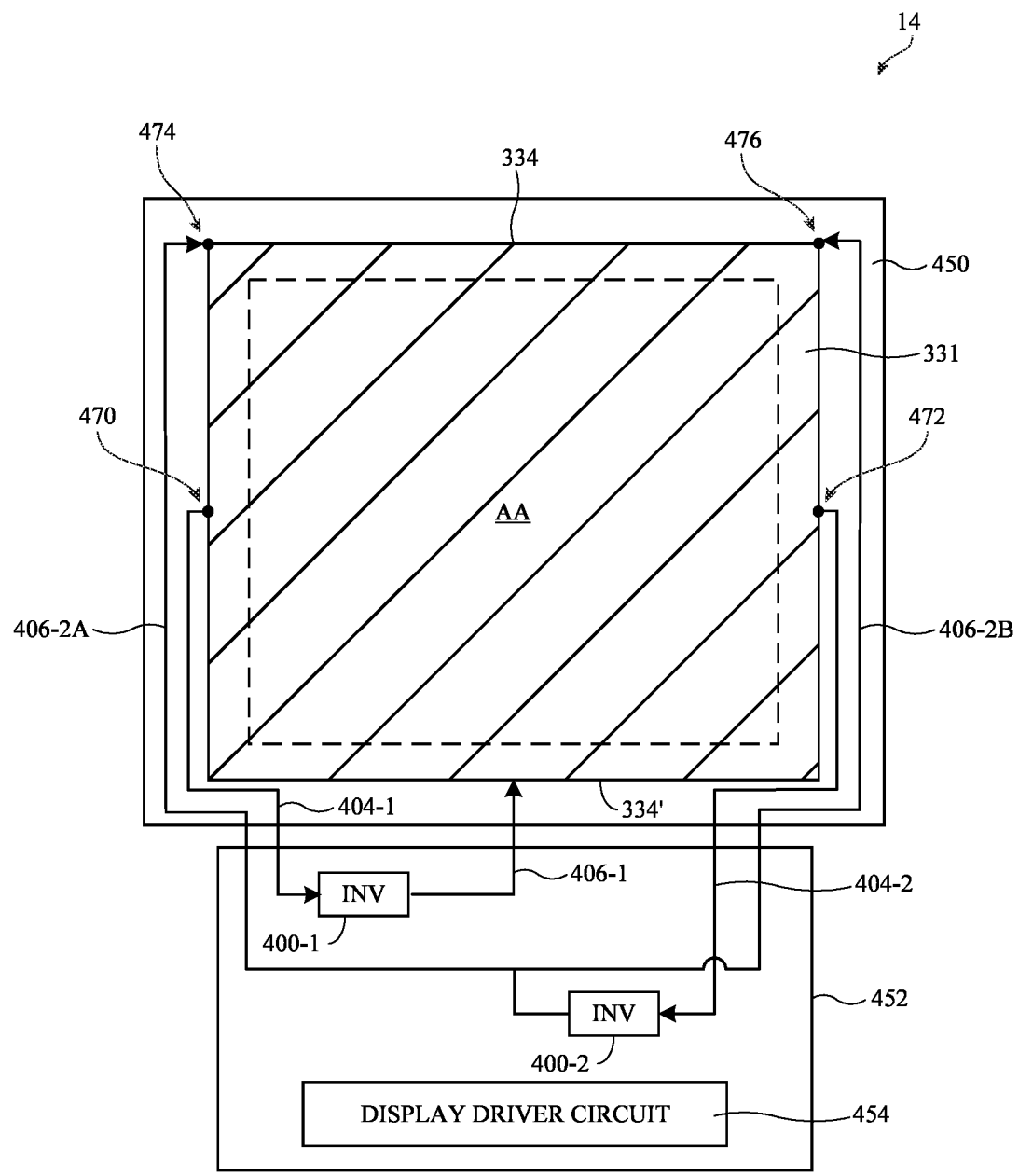
FIG. 12 is a top plan view of a display having illustrative noise cancellation circuitry with inputs coupled to centers of opposing edges of a conductive border in the shielding layer and outputs coupled to different corners of the conductive border in accordance with some embodiments.

The example of FIG. 11 in which the shielding layer includes mesh structure 330 is merely illustrative. FIG. 12 shows another embodiment in which the shielding layer includes transparent conductive film 331 but without any mesh structure (see, e.g., shielding layer 312 of the type shown in FIG. 4B). As shown in FIG. 12, the display and shielding layers may be formed on substrate 450. Display pixels may be formed in an active area AA delineated by the dotted area. Transparent conductive film 331 may cover and overlap the active area AA and may be electrically coupled to a conductive border 334 that completely surrounds active area AA.

When viewed from the perspective of FIG. 12, display substrate 450 of the display panel can be said to have a left peripheral edge, a right peripheral edge, a top peripheral edge joining the top portions of the left and right outer edges, and a bottom peripheral edge joining the bottom portions of the left and right outer edges. Conductive border 334 may be formed along the left, top, right, and bottom peripheral edges of display substrate 450. Display driver integrated circuit 454 (sometimes referred to as a timing controller) may be formed on printed circuit 452 disposed along the bottom peripheral edge of the display panel.

The noise cancelling circuitry may include a first inverting circuit 400-1 and a second inverting circuit 400-2. The noise cancelling circuitry can be formed on printed circuit 452 as discrete components surface mounted on printed circuit 452, as part of display driver integrated circuit 454, or as part of a separate integrated circuit chip mounted on printed circuit 452. First inverting circuit 400-1 may have an input coupled to a center point (see location 470) along a left edge of conductive border 334 via input path 404-1 and may have an output coupled to one or more locations along bottom edge 334' of the shielding structure. Second inverting circuit 400-2 may have an input coupled to a center point (see location 472) along a right edge of conductive border 334 via input path 404-2 and may have an output that is coupled to a top left corner (see location 474) of the shielding structure via first output path 406-2a and that is coupled to a top right corner (see location 476) of the shielding structure via second output path 406-2b. Using a double-ended or head-to-head driving scheme in this way can help reduce signal settling time and further enhance noise cancellation capabilities.

The example of FIG. 12 in which the inputs of inverting circuits 400-1 and 400-2 are coupled to the center points of the left and right edges of the shielding structure is merely illustrative. If desired, the inputs of inverting circuits 400-1 and 400-2 can be coupled to any other location(s) along conductive border 334. Similarly, the outputs of inverting circuits 400-1 and 400-2 can be coupled to any other location(s) along conductive border 334.

Figure 13:
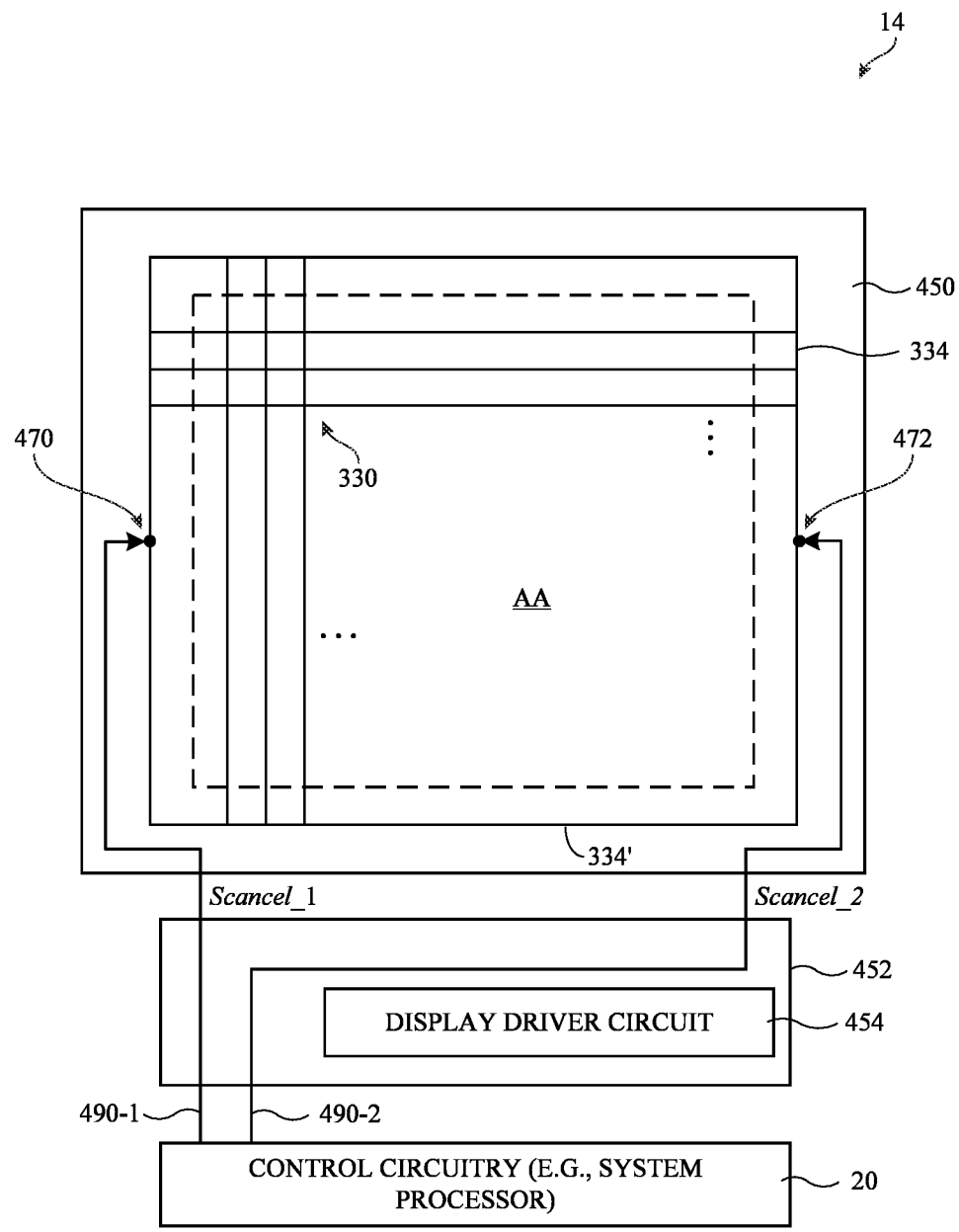
FIG. 13 is a top plan view of a display having a system processor configured to generate noise cancellation signals that are fed to different edges of the shielding mesh in accordance with some embodiments.

The examples of FIGS. 11 and 12 in which the shielding layer receives inverted signals from two analog circuits such as inverting circuits 400-1 and 400-2 is merely illustrative. FIG. 13 shows another embodiment in which the shielding layer receives noise cancellation signals generated by control circuitry 20. As shown in FIG. 13, one or more processors within control circuitry 20 (e.g., a system processor or an application processor) may generate noise cancellation signals Scancel_1 and Scancel_2 using digital signal processing that is optionally dependent on the display content. For example, a given display content may result in a given display noise characteristic, so the system processor may be configured to generate noise compensation signals Scancel_1 and Scancel_2 that can effectively cancel out or mitigate the given display noise characteristic produced by the given display content. Signals Scancel_1 and Scancel_2 may be identical or may be different. The system processor may be mounted on a printed circuit board separate from printed circuit 452 (e.g., the system processor is sometimes mounted on a main logic board separate from flex circuit 452). Signal Scancel_1 may be routed to a center point 470 along the left edge of the shielding structure via output path 490-1, whereas signal Scancel_2 may be routed to a center point 472 along the right edge of the shielding structure via output path 490-2. If desired, signals Scancel_1 and Scancel_2 can be routed to any other location(s) along conductive border 334.

Figure 14:
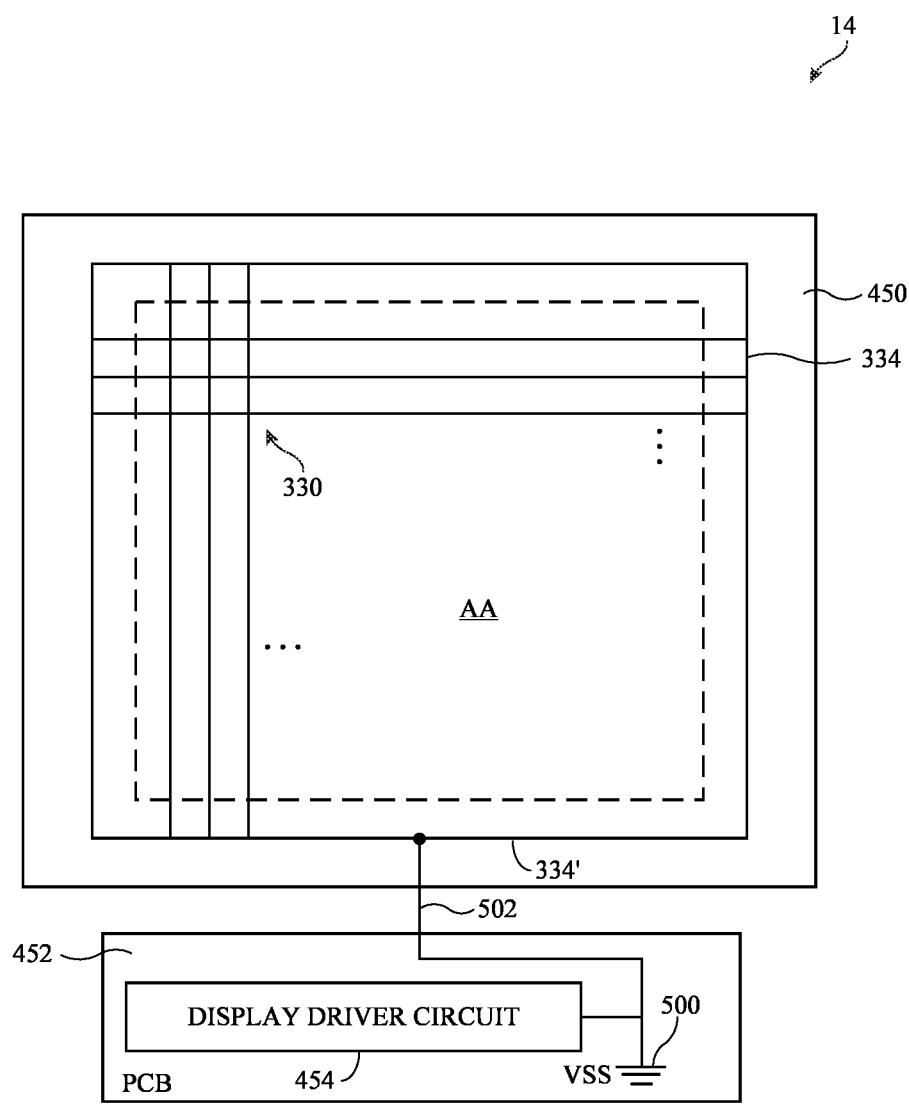
FIG. 14 is a top plan view of a display having an illustrative shielding mesh that is coupled to a power supply voltage in accordance with some embodiments.

The embodiments of FIGS. 6-13 showing how the shielding layer is actively driven using noise canceling signals (e.g., inverted display noise signals or digitally generated noise compensation signals) are merely illustrative. FIG. 14 illustrates another embodiment in which the shielding layer is passively biased using a power supply voltage. As shown in FIG. 14, mesh structure 330 may be coupled to a ground line 500 on printed circuit 452 via path 502. Path 502 may be coupled to one or more locations along bottom edge 334' of the conductive border. A ground power supply voltage VSS may be provided on ground line 500. Biasing mesh structure 330 to the ground voltage can help reduce the amount of noise coupling from the display circuitry to the touch circuitry. This example in which the shielding structure is biased to ground voltage VSS is merely illustrative. In other embodiments, the shielding structure may be biased to a positive power supply voltage VDD, to a reference voltage, to an initialization voltage, to a reset voltage, to a bias voltage, or other static or time-varying voltages.

The top plan view of FIG. 14 may represent shielding layer 312 of the type shown in FIG. 4A that includes conductive shielding mesh structure 330. If desired, FIG. 14 may also represent shielding layer 312 of the type shown in FIG. 4C where transparent conductive film 331 is formed below the mesh shielding structure 330 or shielding layer 312 of the type shown in FIG. 4D where transparent conductive film 331 is formed above the mesh shielding structure 330. Transparent conductive film 331 is not explicitly labeled in FIG. 14 to avoid obscuring the present embodiments.

Figure 15:
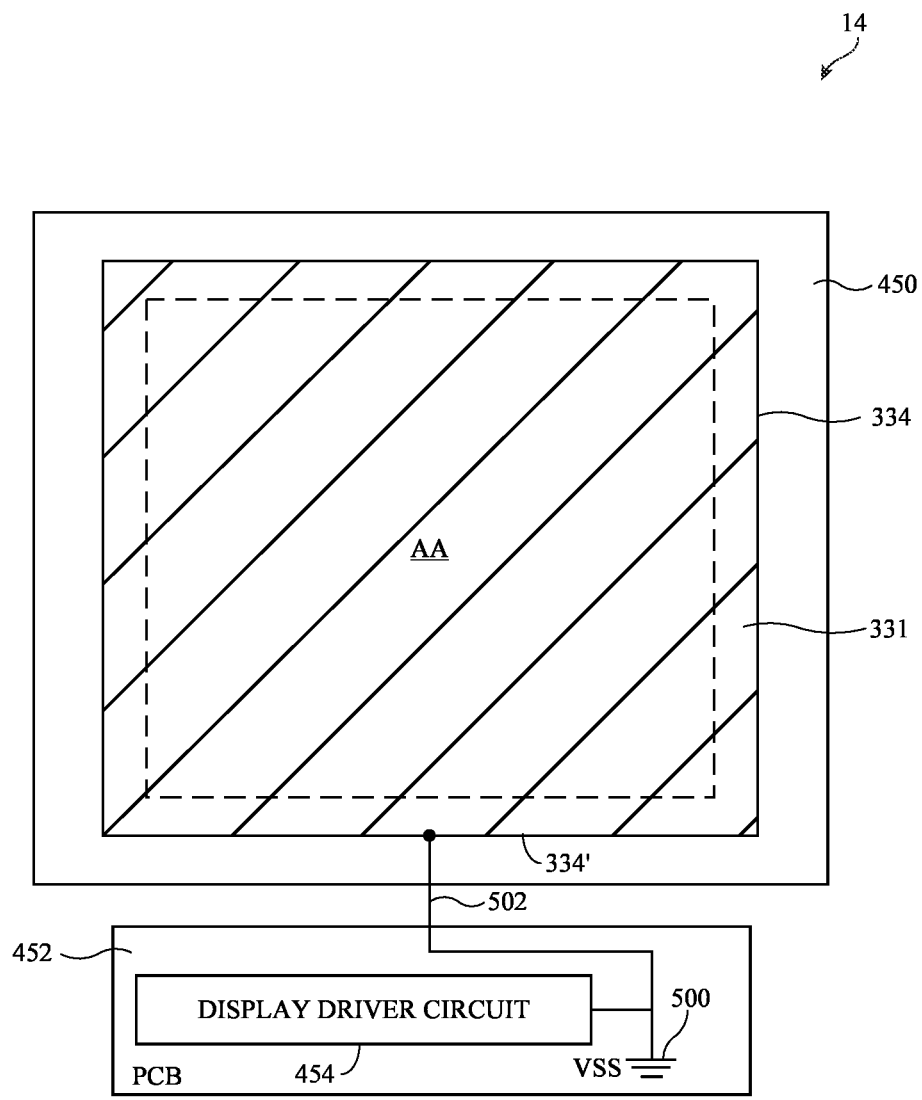
FIG. 15 is a top plan view of a display having an illustrative transparent conductive film that is coupled to a power supply voltage in accordance with some embodiments.

The example of FIG. 14 in which the shielding layer includes mesh structure 330 that is grounded is merely illustrative. FIG. 15 shows another embodiment in which the shielding layer includes transparent conductive film 331 but without any mesh structure (see, e.g., shielding layer 312 of the type shown in FIG. 4B). As shown in FIG. 15, transparent conductive film 331 (which is electrically coupled to conductive border 334) may be coupled to ground line 500 on printed circuit 452 via path 502. Path 502 may be coupled to one or more locations along bottom edge 334' of conductive border 334. A ground power supply voltage VSS may be provided on ground line 500. Biasing transparent conductive film 331 to the ground voltage can help reduce the amount of noise coupling from the display circuitry to the touch circuitry. This example in which the shielding film 331 is biased to ground voltage VSS is merely illustrative. In other embodiments, the shielding film may be biased to a positive power supply voltage VDD, to a reference voltage, to an initialization voltage, to a reset voltage, to a bias voltage, or other static voltages.

Figure 16:
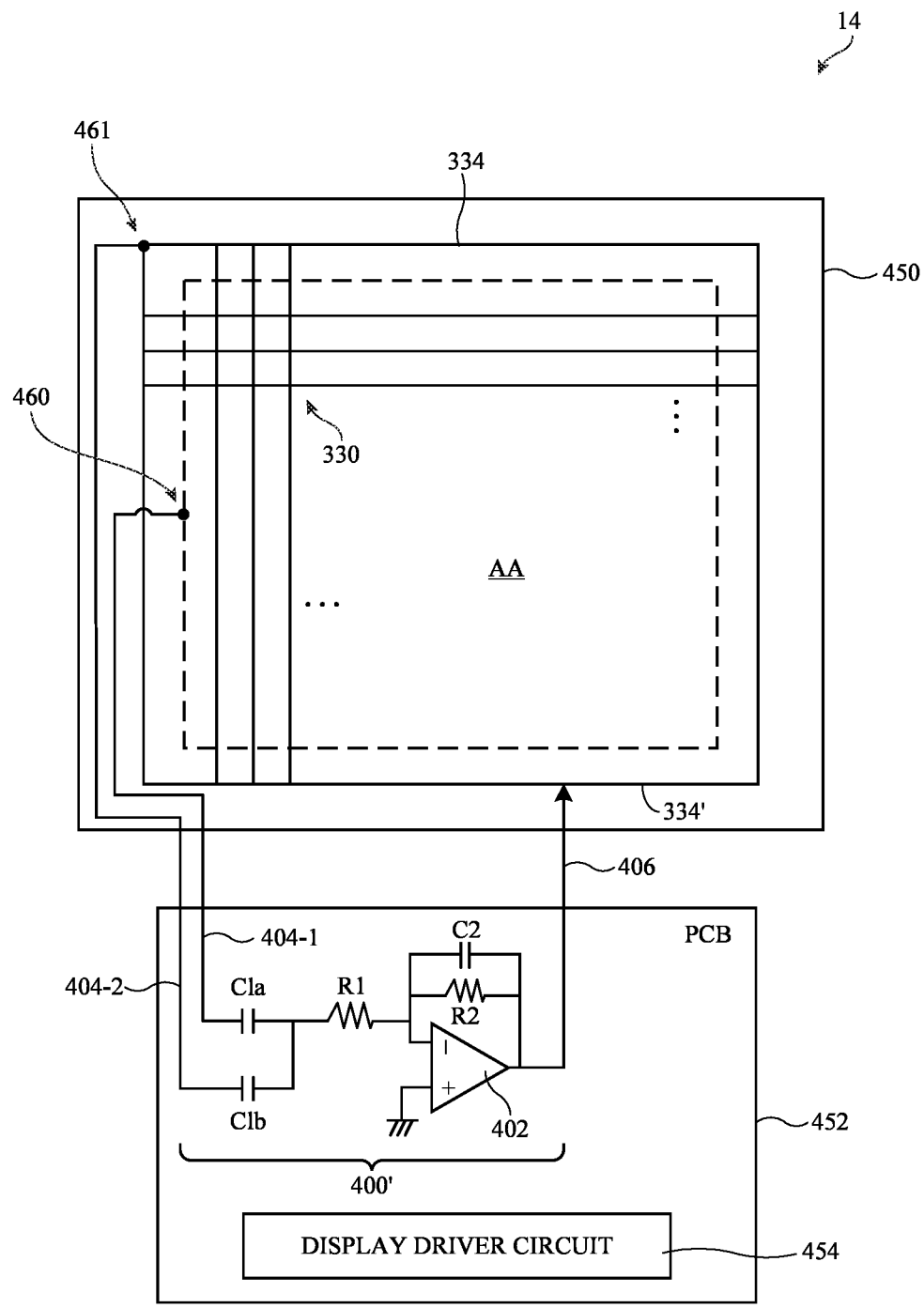
FIG. 16 is a top plan view of a display having illustrative noise cancellation circuitry with an input coupled to an edge of the cathode layer and to a corner of the shielding mesh in accordance with some embodiments.

The example of FIG. 7 in which the inverting circuit has an input that only taps into the cathode layer or the example of FIG. 8 in which the inverting circuit has an input that only taps into the conductive shielding structure is merely illustrative. FIG. 16 illustrates another suitable embodiment where noise cancelling inverting circuit 400' has an input that taps into both the cathode layer and the conductive shielding structure. As shown in FIG. 16, inverting circuit 400' includes an operational amplifier 402 having a first (positive) input coupled to ground, a second (negative) input, and an output coupled to output path 406. Output path 406 may be coupled to one or more locations along the bottom edge 334' of conductive border 334. Inverting circuit 400 may include capacitor C2 and resistor R2 coupled in parallel between the output and the negative input of operational amplifier 402. Inverting circuit 400 may further include resistor R1 coupled to the positive input of operational amplifier 402, capacitor C1a having a first terminal coupled to resistor R1 and a second terminal coupled to an edge of the display cathode layer via first input path 404-1, and capacitor C1b having a first terminal coupled to resistor R1 and a second terminal coupled to a corner of the conductive mesh 330 via second input path 404-2.

The example of FIG. 16 in which path 404-1 is coupled to a center point 460 along the left edge of the cathode layer and path 404-2 is coupled to a top left corner 461 of the conductive shielding mesh is merely illustrative. In general, path 404-1 may be coupled to any one or more locations along the border of the cathode layer, whereas 404-2 may be coupled to any one or more locations along conductive border 334. The example of FIG. 16 may also represent a shielding layer having a transparent conductive film formed under mesh 330 (see, e.g., shielding layer 312 of the type shown in FIG. 4C) or a shielding layer having a transparent conductive film formed on mesh 330 (see, e.g., shielding layer 312 of the type shown in FIG. 4D). If desired, the shielding layer in FIG. 16 need not include any mesh structure and may only include a transparent conductive film (see, e.g., shielding layer 312 of the type shown in FIG. 4B).

Figure 17:
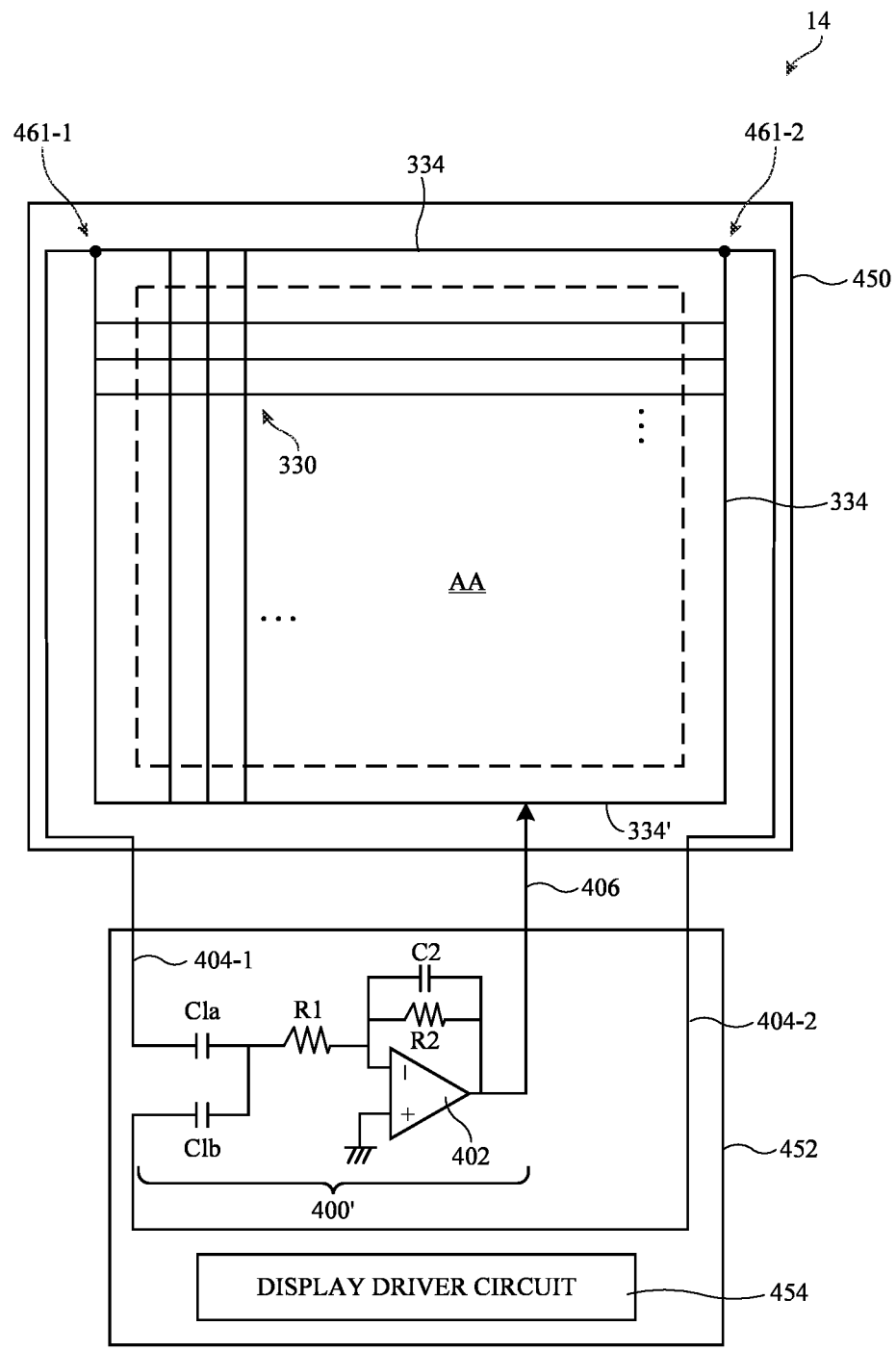
FIG. 17 is a top plan view of a display having illustrative noise cancellation circuitry with an input coupled to different corners of the shielding mesh in accordance with some embodiments.

The example of FIG. 8 in which the inverting circuit has an input that taps into only one location along the conductive shielding structure is merely illustrative. FIG. 17 illustrates another suitable embodiment where noise cancelling inverting circuit 400' has an input that taps into multiple locations along the conductive shielding structure. As shown in FIG. 17, inverting circuit 400' includes an operational amplifier 402 having a first (positive) input coupled to ground, a second (negative) input, and an output coupled to output path 406. Output path 406 may be coupled to one or more locations along the bottom edge 334' of conductive border 334. Inverting circuit 400 may include capacitor C2 and resistor R2 coupled in parallel between the output and the negative input of operational amplifier 402. Inverting circuit 400 may further include resistor R1 coupled to the positive input of operational amplifier 402, capacitor C1a having a first terminal coupled to resistor R1 and a second terminal coupled to a first corner 461-1 of conductive mesh 330 via first input path 404-1, and capacitor C1b having a first terminal coupled to resistor R1 and a second terminal coupled to a second corner 461-2 of the conductive mesh 330 via second input path 404-2. By coupling inverting circuit 400' to both sides of the conductive shielding structure, the risk of over compensating one side of the display relative to the other is reduced.

The example of FIG. 17 in which path 404-1 is coupled to the top left corner 461-1 of the conductive shielding mesh and path 404-2 is coupled to a top right corner 461-2 of the conductive shielding mesh is merely illustrative. In general, path 404-1 may be coupled to any one or more locations along conductive border 334, whereas 404-2 may be coupled to any one or more locations along conductive border 334. The example of FIG. 17 may also represent a shielding layer having a transparent conductive film formed under mesh 330 (see, e.g., shielding layer 312 of the type shown in FIG. 4C) or a shielding layer having a transparent conductive film formed on mesh 330 (see, e.g., shielding layer 312 of the type shown in FIG. 4D). If desired, the shielding layer in FIG. 17 need not include any mesh structure and may only include a transparent conductive film (see, e.g., shielding layer 312 of the type shown in FIG. 4B).

The foregoing is merely illustrative and various modifications can be made to the described embodiments. The foregoing embodiments may be implemented individually or in any combination.

What is claimed is:

1. An electronic device, comprising:
   a housing;
   display circuitry having pixels formed using an anode layer and a cathode layer;
   touch sensor circuitry formed above and overlapping the display circuitry within the housing;
   a shielding layer interposed between the display circuitry and the touch sensor circuitry; and
   noise cancellation circuitry having an input connected to the display circuitry for receiving a noise signal from the display circuitry, wherein the noise cancellation circuitry is configured to invert the noise signal and to drive the inverted noise signal onto the shielding layer to prevent noise associated with the display circuitry from interfering with the touch sensor circuitry.

2. The electronic device of claim 1, wherein the shielding layer comprises a transparent conductive film coupled to a conductive border that completely surrounds an active area in which the pixels are formed.

3. The electronic device of claim 1, wherein the noise cancellation circuitry comprises an inverting circuit having:
   an input coupled to the cathode layer and coupled to a conductive shielding structure in the shielding layer, and
   an output coupled to the conductive shielding structure.

4. The electronic device of claim 1, wherein the shielding layer comprises a conductive mesh structure having an array of openings aligned with respective subpixels of the display circuitry.

5. The electronic device of claim 4, wherein the shielding layer further comprises a transparent conductive film formed below the conductive mesh structure.

6. The electronic device of claim 4, wherein the shielding layer further comprises a transparent conductive film formed on the conductive mesh structure.

7. The electronic device of claim 1, wherein the noise cancellation circuitry comprises:
   an inverting circuit having an input coupled to the cathode layer and an output coupled to a conductive shielding structure in the shielding layer.

8. The electronic device of claim 7, wherein:
   the display circuitry is formed on a display substrate having a first peripheral edge, a second peripheral edge opposing the first peripheral edge, a third peripheral edge joining the first and second peripheral edges, and a fourth peripheral edge opposing the third peripheral edge and joining the first and second peripheral edges;
   the noise cancellation circuitry is formed on a printed circuit coupled to the first peripheral edge;
   the output of the inverting circuit is coupled to an edge of the conductive shielding structure disposed along the first peripheral edge of the display substrate; and
   the input of the inverting circuit is coupled to an edge of the cathode layer disposed along the third or fourth peripheral edge of the display substrate.

9. The electronic device of claim 1, wherein the noise cancellation circuitry comprises:
   an inverting circuit having an input coupled to a conductive shielding structure in the shielding layer and an output coupled to the conductive shielding structure in the shielding layer.

10. The electronic device of claim 9, wherein:
    the display circuitry is formed on a display substrate having a first peripheral edge, a second peripheral edge opposing the first peripheral edge, a third peripheral edge joining the first and second peripheral edges, and a fourth peripheral edge opposing the third peripheral edge and joining the first and second peripheral edges;
    the noise cancellation circuitry is formed on a printed circuit coupled to the first peripheral edge;
    the output of the inverting circuit is coupled to an edge of the conductive shielding structure disposed along the first peripheral edge of the display substrate; and
    the input of the inverting circuit is coupled to another edge of the conductive shielding structure disposed along the third or fourth peripheral edge of the display substrate or to one of the corners of the conductive shielding structure.

11. The electronic device of claim 1, wherein the noise cancellation circuitry comprises:
    a first inverting circuit having an input coupled to a conductive shielding structure in the shielding layer and an output coupled to the conductive shielding structure; and
    a second inverting circuit having an input coupled to the conductive shielding structure and an output coupled to the conductive shielding structure.

12. The electronic device of claim 11, wherein:
    the display circuitry is formed on a display substrate having a first peripheral edge, a second peripheral edge opposing the first peripheral edge, a third peripheral edge joining the first and second peripheral edges, and a fourth peripheral edge opposing the third peripheral edge and joining the first and second peripheral edges;
    the noise cancellation circuitry is formed on a printed circuit coupled to the first peripheral edge;
    the output of the first inverting circuit is coupled to an edge of the conductive shielding structure disposed along the first peripheral edge of the display substrate;
    the input of the first inverting circuit is coupled to another edge of the conductive shielding structure disposed along the third peripheral edge of the display substrate;
    the output of the second inverting circuit is coupled to first and second corners of the conductive shielding structure via first and second output paths; and
    the input of the second inverting circuit is coupled to another edge of the conductive shielding structure disposed along the fourth peripheral edge of the display substrate.

13. An electronic device, comprising:
    a housing;
    display circuitry having pixels formed using an anode layer and a cathode layer;
    touch sensor circuitry formed above and overlapping the display circuitry within the housing;
    a shielding layer interposed between the display circuitry and the touch sensor circuitry; and
    noise cancellation circuitry configured to receive a noise signal, to invert the noise signal, and to drive the inverted noise signal onto the shielding layer to prevent noise associated with the display circuitry from interfering with the touch sensor circuitry, wherein the noise cancellation circuitry comprises an inverting circuit having:
      an input coupled to a first location on a conductive shielding structure in the shielding layer and coupled to a second location on the conductive shielding structure different than the first location, and
      an output coupled to the conductive shielding structure.

14. The electronic device of claim 13, wherein the shielding layer comprises a conductive mesh structure having an array of openings aligned with respective subpixels of the display circuitry.

15. The electronic device of claim 14, wherein the shielding layer further comprises a transparent conductive film formed below the conductive mesh structure.

16. The electronic device of claim 14, wherein the shielding layer further comprises a transparent conductive film formed on the conductive mesh structure.

17. The electronic device of claim 13, wherein the shielding layer comprises a transparent conductive film coupled to a conductive border that completely surrounds an active area in which the pixels are formed.

18. An electronic device, comprising:
a housing;
display circuitry having pixels formed using an anode layer and a cathode layer;
touch sensor circuitry formed above and overlapping the display circuitry within the housing;
a shielding layer interposed between the display circuitry and the touch sensor circuitry; and
noise cancellation circuitry having an input connected to the shielding layer for receiving a noise signal, wherein the noise cancellation circuitry is configured to invert the noise signal and to drive the inverted noise signal onto the shielding layer.

19. The electronic device of claim 18, wherein the shielding layer comprises a conductive mesh structure having an array of openings aligned with respective subpixels of the display circuitry.

20. The electronic device of claim 19, wherein the shielding layer further comprises a transparent conductive film formed below the conductive mesh structure.

21. The electronic device of claim 19, wherein the shielding layer further comprises a transparent conductive film formed on the conductive mesh structure.

22. The electronic device of claim 18, wherein the shielding layer comprises a transparent conductive film coupled to a conductive border that completely surrounds an active area in which the pixels are formed.

23. The electronic device of claim 18, wherein:
the display circuitry is formed on a display substrate having a first peripheral edge, a second peripheral edge opposing the first peripheral edge, a third peripheral edge joining the first and second peripheral edges, and a fourth peripheral edge opposing the third peripheral edge and joining the first and second peripheral edges;
the noise cancellation circuitry is formed on a printed circuit disposed along the first peripheral edge;
the output of the inverting circuit is coupled to an edge of the conductive shielding structure disposed along the first peripheral edge of the display substrate; and
the input of the inverting circuit is coupled to another edge of the conductive shielding structure disposed along the third or fourth peripheral edge of the display substrate or to one of the corners of the conductive shielding structure.

\* \* \* \* \*